United States Patent
Einhart et al.

(10) Patent No.: US 6,531,876 B1
(45) Date of Patent: Mar. 11, 2003

(54) APPARATUS FOR VOLTAGE MEASUREMENT (75) Inventors: Johann Einhart, Uhldingen (DE); Anton Sonntag, Ulm (DE); Josef Sonntag, Kirchheim (DE)

(73) Assignee: Ballard Power Systems AG, Teck-Nabern (DE)

(*) Notice: Subject to any disclaimer, the term of this patent is extended or adjusted under 35 U.S.C. 154(b) by 0 days.

(21) Appl. No.: 09/719,864

(22) PCT Filed: May 21, 1999

(86) PCT No.: PCT/EP99/03493

§ 371 (c)(1),
(2), (4) Date: Feb. 28, 2001

(87) PCT Pub. No.: WO94/09374

PCT Pub. Date: Apr. 28, 1994

(30) Foreign Application Priority Data

Jun. 18, 1998 (DE) .......................................... 198 27 045

(51) Int. Cl.$^7$ ............................................. G01N 27/416

(52) U.S. Cl. ........................................ 324/434; 324/771

(58) Field of Search ................................ 324/771, 434, 324/754, 762, 755

(56) References Cited

U.S. PATENT DOCUMENTS

| | | | | |
|---|---|---|---|---|
| 3,818,325 A | | 6/1974 | Boshers ....................... 324/437 |
| 5,519,331 A | * | 5/1996 | Cowart ......................... 324/755 |
| 5,654,647 A | * | 8/1997 | Uhling .......................... 324/754 |
| 5,757,201 A | * | 5/1998 | Partridge ..................... 324/755 |
| 5,808,475 A | * | 9/1998 | Knauer ......................... 324/754 |

FOREIGN PATENT DOCUMENTS

| | | |
|---|---|---|
| JP | 07260825 | 10/1994 |
| WO | 94/09374 | 4/1994 |

* cited by examiner

Primary Examiner—Christine Oda
(74) Attorney, Agent, or Firm—Crowell & Moring LLP (57) ABSTRACT An apparatus for measuring the voltage of a plurality of voltage sources mounted in a stack includes a plurality of contact units, each having a plurality of electrical contacts mounted therein, for voltage tapping of the voltage sources. The contact units are held in a support module, arranged side by side along a longitudinal axis. An evaluation unit is coupled in communication with the contacts contained in the contact units, either directly, or via an intermediate unit that includes addressing and processing capability. The number of contact units that are arranged in the support module is variable in accordance with the number of voltage sources contained in the stack, and the contact units themselves are movable longitudinally within the support module to accommodate spacing of the voltage sources in the stack.

21 Claims, 4 Drawing Sheets

APPARATUS FOR VOLTAGE MEASUREMENT

BACKGROUND AND SUMMARY OF THE INVENTION

This application claims the priority of PCT International Application No. PCT/EP99/03493, filed May 21, 1999 and German patent document 198 27 045.3, filed Jun. 18, 1998.

The invention relates to an apparatus for voltage measurement on a plurality of identical voltage sources.

A voltage source of this generic type is formed, for example, from one or more elementary battery cells, or from one or more elementary fuel cells.

One preferred field of application for such a voltage measurement arrangement is fuel cell systems, particularly $H_2/O_2$ fuel cells, which normally supply a cell voltage of approximately 0.5 V to 1.0 V. In order to achieve higher voltages, and thus higher power levels, individual fuel cells are connected in series to form a stack. When the fuel cells are being operated, it is necessary to ensure that they operate effectively and that the power supplied from the fuel cell stack does not force individual fuel cells to assume impermissible or dangerous operating states with a negative cell voltage, but that the cell voltages are maintained within a certain bandwidth, depending on the load state. Furthermore, it is desirable to be able to detect defects, which can lead to failure of a fuel cell, at the $H_2/O_2$ separation unit.

German patent document DE-A1 43 38 178 discloses an arrangement in which fuel cell stacks are connected in series in at least two parallel connected rows each having the same number of stacks, and in which the rows are split into arms of a bridge circuit and are connected to at least one evaluation arrangement which evaluates the voltage or current tapped off between the arms.

German patent document DE-C2 195 23 260 discloses a method for monitoring more than two identical voltage source units, in which contact tips are pressed against carbon contacts of fuel cell stacks which are combined to form blocks. However, the contact with the stacks is susceptible to vibration and, in particular is not suitable for use in a motor vehicle since, essentially only a stationary measurement is possible, and not continuous measurement in operational conditions.

One object of the present invention is to provide an arrangement for voltage measurement on a plurality of identical voltage source units, which is simple to fit, allows permanent voltage monitoring and flexible handling as well as simple and cost-effective matching to fuel cell stacks of different size.

Another object of the invention is to provide such a voltage measurement arrangement which is suitable in particular for use in mobile systems such as motor vehicles, as well as in stationary systems.

These and other objects and advantages are achieved by the voltage measurement arrangement according to the invention which includes contact-making means ("contacts") for voltage tapping, as well as an evaluation unit which is connected to the contacts. At least a number of contacts are physically combined in a contact unit. The contact unit preferably has a holder, electrically conductive contacts and electrical connectors, in particular pin-type plug connectors, for an evaluation unit or for an intermediate unit which is connected between the evaluation unit and the contact unit. It is particularly preferable for the contacts of the contact unit to have electrical spring contacts which can be detached from voltage source units with which contact is to be made.

In one advantageous arrangement the contact unit is in the form of a flat plate on which spring contacts are arranged approximately parallel to one another and projecting essentially at right angles from the longitudinal axis of the plate. The spring contacts are each firmly electrically conductively connected at one end to the respective associated electrical contact surface, and their free end can move at least in the direction of the longitudinal axis. In this case, it is particularly expedient for the contacts to have a corrosion-resistant metallic surface, at least in some places. It is advantageous for retaining surfaces for contacts to be provided for voltage tapping on the surface of the voltage source units.

In one preferred arrangement, the contact unit is arranged in a holder module such that it can be moved in the direction of its longitudinal axis. It is advantageous to arrange a number of contact units side by side in the direction of their longitudinal axis in a holder module, so that the contacts point outwards like a comb.

The contact unit expediently projects at right angles into a guide rail of a holder module in such a way that the contact unit can be moved along the guide rail parallel to the longitudinal extent of a housing, or parallel to a stacking direction of the voltage source units.

The evaluation unit is advantageously arranged in a housing. It is advantageous for the evaluation unit to be a central controller. In further advantageous refinement the evaluation unit has a unit for addressing and/or preprocessing of measurement data. It is particularly advantageous for an intermediate unit for addressing and/or preprocessing of measurement data to be connected between the contact unit and the evaluation unit.

In one particularly expedient refinement the contact unit is, in each case, at least indirectly electrically connected by means of a ribbon cable to the evaluation unit or to an intermediate unit which is connected between the contact unit and the evaluation unit.

In one particularly preferred refinement, each contact unit is allocated a segment of an intermediate unit. It is advantageous if, in addition to segments, the intermediate unit has a base unit which has at least one data bus interface and/or a microcontroller card. It is advantageous for the intermediate unit to have at least connecting means for a CAN bus.

The segment preferably has multiplexer units and electrical connection means allocated to the segment, to which connection means one or more contact units can be connected.

In one particularly preferred development, contact units are arranged at equal intervals along the longitudinal axis of the intermediate unit. Electrical connection means are preferably arranged at equal intervals along the longitudinal axis of the intermediate unit. Furthermore, regions of multiplexer units are preferably arranged at equal intervals along the longitudinal axis of the intermediate unit, and segments with multiplexer units and connectors are preferably arranged at equal intervals along the longitudinal axis of the intermediate unit.

It is particularly preferable for the longitudinal extent at least of segments, connectors and contact units to be staggered along the longitudinal axis of the intermediate unit. In this case the longitudinal extent of the contact units is a first length L1, the longitudinal extent of the regions of multiplexer units M is a second length LM, the longitudinal extent of the connection means is a third length L4, and the longitudinal extent of the segments is a fourth length L12, where L1>L12>L4>LM.

Advantageously, the longitudinal extent at least of segments, connectors and contact units is staggered along the longitudinal axis of the intermediate unit and is arranged offset with respect to the stacking direction of the voltage source units so that the function of segments, connectors and contact units is maintained when shortened to a present stack length of the voltage source units.

In one advantageous embodiment, the holder module can be attached to the housing. In a further advantageous embodiment, the holder module can be attached to voltage source units.

It is expedient to provide attachment means of the intermediate unit in the housing with means to compensate for changes in the length of the intermediate unit and/or of the housing.

In one particularly advantageous refinement of the invention, the contact unit is connected to a discharge module, which forms a low impedance bridge for at least one voltage source unit. It is thus possible to deliberately discharge units in the voltage source units individually, or to discharge a number of such units in a stack, and to remove them safely, for example for maintenance purposes. It is particularly advantageous for the discharge module to be provided with means for connection of an electronic data processing device and, in particular, to be controllable by software.

The voltage source unit is preferably a fuel cell.

It is particularly preferable for retaining surfaces for the contacts to be provided for voltage tapping on the surface of the fuel cell. This makes contact with spring contacts particularly robust and reliable, in particular with respect to shock and/or vibration.

The modular construction of the apparatus according to the invention allows the apparatus to be used highly flexibly and cost-effectively.

Other objects, advantages and novel features of the present invention will become apparent from the following detailed description of the invention when considered in conjunction with the accompanying drawings.

DETAILED DESCRIPTION OF THE DRAWINGS

The invention is explained in the following text with reference to fuel cell systems. However, it is apparent that the use of the described apparatus according to the invention is not limited to fuel cell systems, but can also be used for other voltage source systems in mobile and stationary systems, such as multicell battery systems and/or rechargeable batteries and/or capacitor banks and/or multi-channel systems. Use in vehicles or other transportation means is particularly advantageous.

A fuel cell stack which is intended to provide electrical power in particular for motor vehicle traction is formed from a large number of series-connected fuel cells, for example 100 to 200 individual cells.

By virtue of its modular construction, the apparatus according to the invention allows the voltage measurement apparatus to be matched very easily and cost-effectively to different fuel cell numbers. Moreover, by virtue of the particular mechanical flexibility of the contacts, it can be matched even to fuel cells with different widths, without having to design and match a new voltage measurement apparatus for each stack version.

Figure 1:
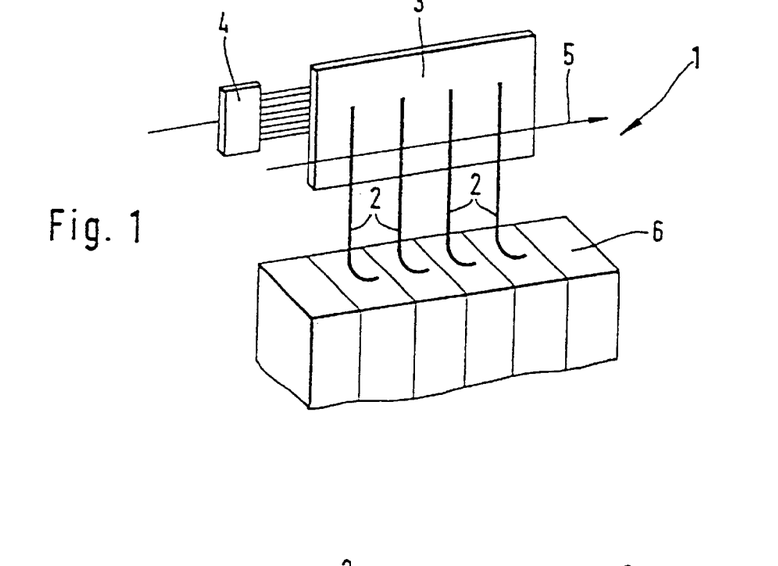
FIG. 1 is a schematic perspective view of a contact unit according to the invention.

A contact unit 1 as claimed is shown in FIG. 1. According to the invention, the contacts 2 are physically combined in the contact unit 1, which preferably includes, in addition to the contacts 2, a holder 3 (in particular a board with conductor tracks) and a connector 4, on which the measured values can be tapped off. The connector 4 is preferably a plug to which a connecting cable can be connected and which is electrically connected to the contacts 2.

One preferred contact unit 1 is a microcontroller card, preferably having a large number of electrical cables as contacts 2, which electrical cables are fitted to the contact unit 1 and are intended for tapping voltages on the voltage source units 6.

One particularly preferred contact unit 1 has a number of spring contacts 2, which are combined on the contact unit. It is advantageous to use a number of contact units 1, arranged in series, for voltage measurement.

The spring contacts have the advantage that, firstly, reliable electric contact can be made with the fuel cells in a fuel cell stack and, secondly the contacts can be detached from the fuel cell stack. During manufacture of the spring contacts, it is possible in a simple manner (in particular by deliberate bending and bending over of the spring wire or of the spring leaf) to allow the spring contacts to have a defined contact pressure. In this manner, the contacts allow reliable electrical contact with the fuel cell, even when the arrangement is subjected to vibration. This is particularly advantageous for use of the voltage measurement apparatus in a vehicle, thus allowing, in particular, permanent monitoring of fuel cells even during operation. The preferred spring contacts can be manufactured cost-effectively, in particular in large quantities. The contact resistance between the spring contacts and the fuel cell is essentially governed by the size of the contact area and by the contact force. The spring force is achieved by the spring wires being bent over through a defined distance during manufacture. When the apparatus according to the invention is being fitted to a fuel cell stack, the desired contact force of the spring contacts can be adjusted.

A further advantage is that the interface complexity between the measurement electronics and the voltage tap is low due to the contacts 2, since there is no need for long measurement cables. This also reduces any susceptibility to interference from electromagnetic radiation for the cell voltage measurement variables, so that the electromagnetic compatibility of the apparatus is highly suitable for use in a motor vehicle, or other usage locations which are subject to electromagnetic radiation. The Applicant's EMC measurements have shown that the apparatus used complies with the present-day requirements for electromagnetic compatibility.

Expediently, at least in the region where contact is intended to be made, each spring contact is provided with a corrosion-resistant metallic coating, preferably being gold-plated. In this case, it is a good idea not to apply the corrosion-resistant coating until after the spring contacts have been bent, in order to avoid the bending stress producing any microscopic cracks in the coating.

The spring contacts are preferably arranged on the holder 3 such that they project from the holder 3 like a comb. In this case, the spring contacts are arranged at right angles to a longitudinal axis 5 of the holder 3, and are aligned essentially parallel to one another. It is particularly advantageous to use a circuit card as the holder 3. The specified grid size of the conductor tracks and/or contact-making points can be used with major advantage since this assists modular construction of the measurement apparatus.

Figure 3:
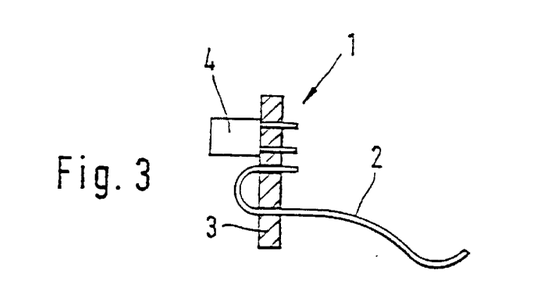
FIG. 3 is a sectional view which shows a contact unit in a holding module.

The spring contacts are fitted to the circuit card in a particularly advantageous way by manufacturing them from a wire which is bent through 90° twice. After being bent, the spring contact is approximately U-shaped, with one long end and one short end. Such a spring is illustrated, for example, in FIG. 3. The two ends are parallel to one another, and the distance between them is preferably a multiple of the circuit card grid of the contact-making unit 1. With a conventional circuit card grid size of 2.54 mm, it is advantageous for the distance between the ends to be 5.08 mm, that is to say twice the grid size.

Both ends of the spring contact are pushed into apertures in the circuit card until they reach a stop and are soldered, thus achieving high mechanical robustness against lateral movement of the spring contacts, in particular during soldering. The contacts are advantageously now parallel so that they can be pressed like a contact comb against the surface of a fuel cell stack, in which case one spring contact in each case expediently makes contact with one fuel cell in a fuel cell stack.

The arrangement either allows the voltage to be measured between a fixed reference point and voltage source units, or allows a differential voltage measurement to be carried out between respectively adjacent voltage source units. The differential voltage measurement has the advantage that defective voltage source units can easily be located.

The contact surface between the spring contact and the fuel cell is produced by the tip of the free end of the wire (expediently the long end) being bent upwards with a radius of a few millimeters. This external radius of the spring wire, together with the fuel cell on the surface with which contact is to be made, represents the contact area. It is advantageous to provide a groove as a retaining surface, which groove is milled in the fuel cell surface and provides stability for the spring contact, once it has been pushed on, against undesirably being moved laterally. It is advantageous to bend the wire downwards once again, with a radius of a few millimeters, at a greater distance from the bent free end. The deflection which is produced in this way later influences the desired contact force when the contact unit 1 is being fitted on the fuel cell stack, avoiding subsequent, complex adjustment of the contact force. In this case, it is apparent that the bending radius, the separation for bending, the thickness and the length of the spring contacts can be matched to the respective measurement problem.

Figure 2:
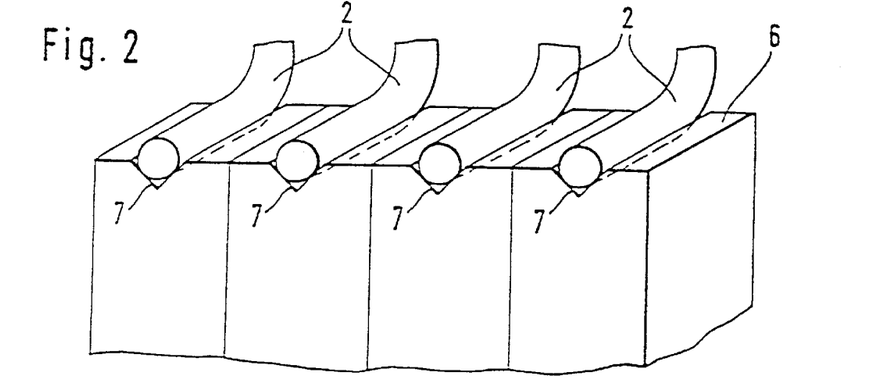
FIG. 2 is a sectional view through a contact region between voltage source units and contacts.

The free end of the spring contacts can in this case not only be moved and pressed at right angles to the contact surface of the fuel cell stack, but can also be moved parallel to this contact surface, in particular parallel to the longitudinal axis of the circuit card 3. This has the particular advantage that temperature-dependant thickness variations of the fuel cells during operation can reliably be compensated for, since the spring contacts can move elastically with the contact surface 7. In addition, adjustment of the spring contact with respect to the contact surfaces 7 of the fuel cells is also simplified, and the requirements for the manufacturing tolerances of the spring contacts are less stringent. A further advantage is that it is also possible to make contact with fuel cell stacks having fuel cells of different thicknesses using the same contact unit, without in each case having to design and manufacture a new voltage measurement apparatus for different thicknesses in each case.

The elasticity of the spring contacts also makes it possible for more than one spring contact to make contact with a fuel cell by, for example, two adjacent spring contacts being fitted in the same contact-making groove. This makes the electrical contact particularly reliable, with a redundant design, since the second contact is functional in the event of any damage to one contact.

Figure 4:
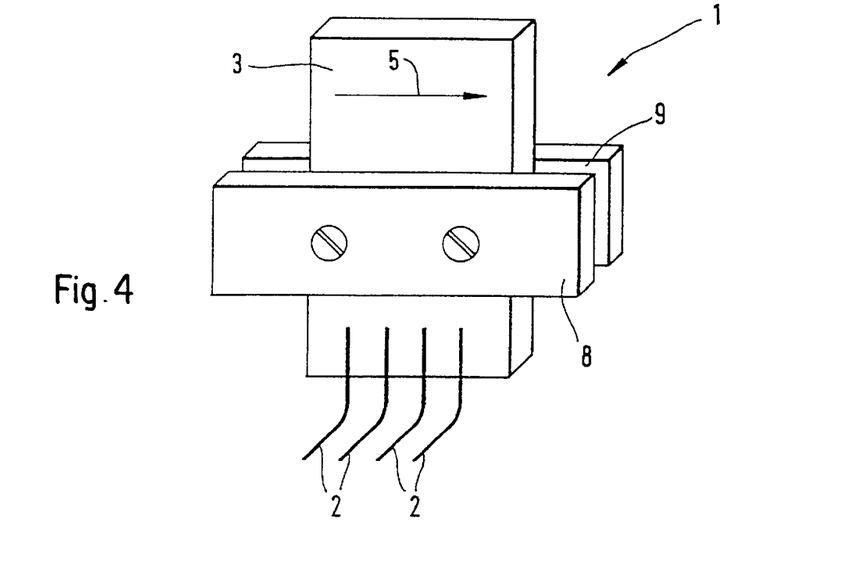
FIG. 4 is a perspective view of an advantageous arrangement of the contact unit.

FIG. 4 shows one advantageous arrangement of the contact unit. (The connectors 4 are not shown.) The holder 3 is arranged in a mounting such that the contact unit 1 can be moved along the longitudinal axis 5 which preferably runs parallel to the stacking direction of the voltage source units. It is particularly preferable for the circuit card 3 to be fixed in the vertical installation position in longitudinal guides 9 in a holder module 8. The contact unit 1 can be moved in the holder module 8 so that the contacts 2 can easily be moved over the contact surfaces 7 on the fuel cell stacks.

It is particularly advantageous for the contact unit 1 to have only a small number (e.g., 1–10) of contacts 2, in which case it is possible to compensate for a small amount of variance in the cell widths of the fuel cells, which can be caused, in particular, by manufacturing tolerances and/or thermal expansion. In order to allow the voltage to be tapped from a stack with voltage source units, a number of preferably identical contact units 1 are used, which are plugged side by side into the longitudinal guide 9 of the holder module 8. The number of contact units 1 which are arranged side by side is preferably that which is necessary in order to make electrical contact with a desired number of voltage source units 6 in a stack of voltage source units. In one preferred embodiment, each individual voltage source unit 6 is provided with a respective contact 2. In a further preferred embodiment, a number of voltage source units 6 are combined as a block, with contacts 2 to be provided for each block.

The contact units 1 can be moved in the longitudinal guide 9 and adjusted with respect to the voltage source units 6, and can then be fixed in the holder module 8. It is particularly advantageous to use plastic holders as the holder module 8. The use of plastic holders ensures that the arrangement has a withstand voltage such that even relatively high voltages, in particular, around 1000 V DC, can be measured with the device having adequate air gaps and creepage distances. In particular, standards which are applicable to motor vehicles can easily be complied with in terms of such requirements for withstand voltages.

Figure 5:
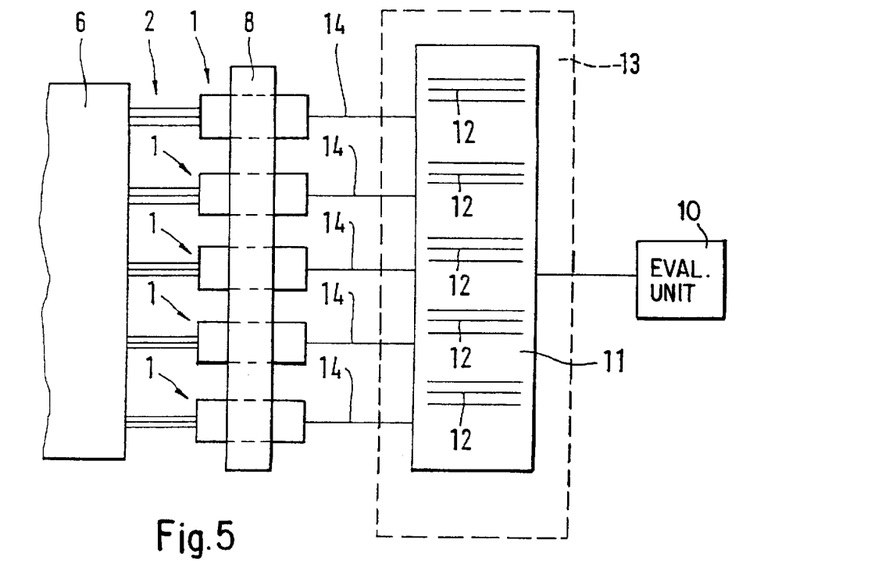
FIG. 5 is a schematic diagram of one advantageous arrangement of the voltage measurement apparatus.

The contact unit 1 is connected at least indirectly to an evaluation unit 10, as shown in FIG. 5. This evaluation unit 10 is preferably a central controller, which has electronic data processing means and can evaluate and further process the measured voltage values which are tapped off by the contacts 2 of the contact unit 1 via the voltage source units 6. It is advantageous for the evaluation unit 10 to have a unit for addressing and/or pre-processing of measurement data. The evaluation unit preferably has connections to a data bus, in particular a CAN bus. The modular construction of the contact units 1 allows measurement data to be evaluated by any desired electronic equipment.

In one particularly preferred arrangement, an intermediate unit 11 is connected between the evaluation unit 10 and the contact unit 1, which intermediate unit 11 is intended at least for addressing contacts 2, contact units 1 and/or for evaluating measurement data. The electrical connection between the contact unit 1 and the evaluation unit 10 or intermediate unit 11 is preferably produced via a ribbon cable 14 between the connection element 4 of the contact-making unit 1 and the respectively connected unit 11 or 10. The connection between the intermediate unit 11 and the evaluation unit 10 is preferably produced via a data bus. In addition, the measured voltage data recorded by the voltage measurement apparatus according to the invention can be further processed with further measurement variables, in particular analog values such as temperature for fuel cells, cooling water temperatures for fuel cells, gas composition, and/or information about the integrity of the data bus, information about the integrity of the electrical contact with the voltage source units 6, and other data relevant for operation of a fuel cell system, and/or fault and alarm signals, preferably using an electronic data processing system.

One advantageous method for voltage measurement in this case is to detect the voltage difference between two adjacent voltage source units.

In a particularly preferred embodiment, the intermediate unit 11 is a microcontroller card, which is subdivided into segments 12. It is particularly advantageous for each contact unit 1 to be allocated one segment 12 of the microcontroller card, with the segments 12 and contact units 1 geometrically related to a standard grid size. It is also advantageous to provide at least one link to a data bus, in particular a CAN bus. The microcontroller card is preferably designed such that adequate electrical creepage distances and air gaps are provided for measuring relatively high voltages, preferably around 1000 V DC, in particular in a fuel cell vehicle.

The intermediate unit 11 is preferably arranged in a housing 13, which is preferably formed from a cover part and a bottom part, and includes means to accommodate the intermediate unit 11 movably therein. It is advantageous to use a standard extruded profile composed of aluminium as the housing 13, which is available as cost-effective goods sold by the meter, and whose dimensions can easily be matched to the microcontroller card. The connection points and any bushings of the housing 13 are preferably designed to be at least shower-proof, so that the microcontroller card is reliably protected against the influences of weather from all directions, particularly when the apparatus is being operated in a vehicle.

The housing 13 expediently has means for securing the contact units 1 and/or the holder module 8, at least mechanically on the housing 13. It is advantageous to provide the means with adjustment capabilities in order to allow the units to be moved and/or retrospectively matched to temperature-dependant length changes of the units.

In one preferred embodiment, an intermediate unit 11 is designed for a maximum number $N_{max}$ of voltage source units 6 and/or contact units 1 and/or contacts 2 such that it is possible to measure stack versions having from 1 up to $N_{max}$ voltage source units 6 based on the same intermediate unit 11. The microcontroller card and/or the housing 13 can be shortened to match the number of voltage source units 6 in a stack.

In one preferred embodiment, voltages from up to $N_{max}$= 200 fuel cells in a stack can be detected in a period in the region of a few milliseconds per channel, preferably 1 millisecond per channel. The evaluation unit 10 and any software provided for the evaluation unit are likewise expediently designed for the same maximum number $N_{max}$, so that the actual number of voltage measurements can be configured in a simple way by means of the software. The length of the microcontroller card is preferably at least proportional to the number of contact units 1 which are physically combined in the apparatus according to the invention. It is particularly preferable for the lengths of the microcontroller card, of the housing 13 and the overall length of the contact units 1 which are provided to be approximately the same, and, expediently, to correspond to the length of the stack of voltage source units 6. This allows the apparatus to be fitted directly, if appropriate with electrical insulation, over the voltage source units 6.

In one preferred arrangement, contact units 1 are at least mechanically firmly connected to the housing 13, so that contacts units 1 and the housing 13, together with the intermediate unit 11 are arranged adjacent to the voltage source units 6, during continuous operation. The evaluation unit 10 can be arranged remotely from this arrangement. It is also possible to arrange the housing 13 together with the intermediate unit 11 and/or the evaluation unit 10 at a relatively long distance from the voltage source units 6. It is advantageous to connect them by means of ribbon cables. The voltage source units 6 can be permanently monitored during operation.

It is particularly advantageous to provide a discharge module for individual voltage source units 6 or blocks of voltage source units 6, with the discharge module being integrated in the intermediate unit 11 or in the evaluation unit 10. The discharge module is, in particular, software-configurable and can be actuated such that, in the event of a fault, it discharges any faulty voltage source units to non-critical voltage levels, which are predetermined and/or monitored by the evaluation unit 10. Preferably, the voltage state of a cell or of a monitored cell stack is first of all measured, and it is then discharged. Any faulty voltage source units 6 can then safely be accessed by the user, for maintenance purposes.

In a further preferred arrangement contact units 1 are mounted such that they are at least mechanically fixed on the voltage source units 6. This is advantageous if the operating temperature of or ambient temperature around the voltage source units 6 is high. The intermediate unit 11 and the evaluation unit 10 can be accommodated remotely, in ambient temperatures which are acceptable for them. The connection to the contact unit 1 can then be produced as required, in particular during maintenance intervals, by the connection means 4 being electrically connected to the intermediate unit 11, or to the evaluation unit 10. The capability for decentralized installation of the modules formed by the evaluation unit 10, the intermediate unit 11 with the segments 12 in the housing 13 and connecting cables from the connectors 4 to the contact unit 1, is particularly advantageous where there are space problems or problems involved in mounting on the voltage source units.

A further advantage is that, when the contact unit 1 is mounted directly on the stack of voltage source units 6, the voltage measurement device requires only a very small installation space, which is particularly advantageous for installation in a vehicle with fuel cells. It is thus even possible to monitor the voltage and status of the fuel cells only at intervals during a maintenance procedure and/or during diagnosis of the vehicle, so that there is no need to install rather expensive evaluation electronics in every vehicle, and such electronics need be available only in a stationary form, in appropriate maintenance facilities. A single set of evaluation electronics at that location is then sufficient for widely differing applications. In one particularly advantageous refinement, the microcontroller card 11 is designed such that information about the number of voltage source units 6 and the nature of the interconnection of the voltage source units 6 is stored in the microcontroller. The stored information can advantageously be checked on the vehicle, from the outside, preferably by means of a plug, for carrying out a bus scan. Thus, when different versions of voltage source stacks exist, for example in different vehicle versions, the number of voltage source units 6 and the nature of the interconnection of the voltage source units 6 can be identified from the outside, without having to open the system. This is particularly maintenance-friendly.

It is thus possible to use a standard measurement system and standard software for different stack versions of voltage source units. Based on a standard geometric design and a standard design for addressing and/or actuating the measurement apparatus, it is advantageously possible to provide an apparatus for a range of stacks of voltage source units 6 with different numbers of voltage source units 6 and/or with voltage source units 6 of different thicknesses.

Figure 6:
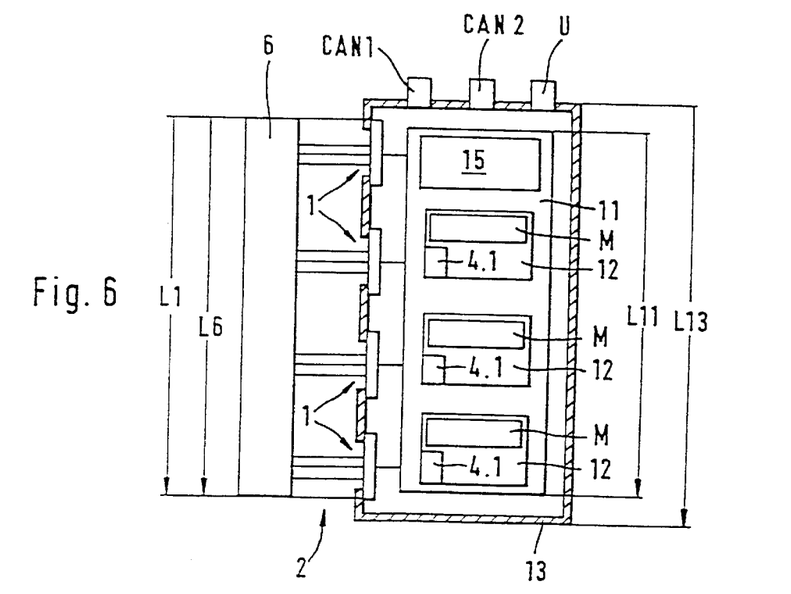
FIG. 6 shows details of a preferred intermediate unit.

FIG. 6 shows a particularly preferred embodiment of the modular voltage measurement apparatus. A housing 13 encases a primary card as the intermediate unit 11, which has a base unit 15 which is provided with data bus connecting means on an interface card, and with elements for electronic actuation on a microcontroller card.

The size of the base unit 15 defines a minimum size L11 for the primary card 11. The base unit 15 is arranged at one end of the primary card. Multiplexer units M, each having associated connectors 4.1, are then mounted in segments 12 along the longitudinal axis of the primary card on the base unit 15. The longitudinal axis of the primary card is parallel to the stacking direction of the voltage source units 6. The connectors 4.1 are preferably pin-type plugs, which are permanently mounted on the primary card 11. Electrical cables 14 from one or more contact units 1 can be plugged into the pin-type plugs 4.1. The electrical cables 14 are preferably ribbon cables. Each connected contact 2 may be regarded as a measurement channel. The measurement accuracy of the preferred apparatus is around ±5 mV per channel, and the measurement rate is around 1 ms per channel.

Connectors for at least one CAN bus and one voltage supply U for the primary card are provided on the housing 13. In particular, the primary card 11 can be operated with voltages between 7 and 36 volts. It is also possible to provide the electrical supply for the primary card by means of the voltage source units 6 with which contact has been made themselves, and the multiplex units M can advantageously be used for this purpose, so that the voltage source units 6 are not loaded asymmetrically. The contacts 2 are in this case addressed and switched on a cycle of milliseconds per contacts. Two connection options CAN1, CAN2 for CAN bus are preferably possible, so that, apart from a connection to an actuating unit 10 via a first CAN bus CAN1, it is also possible to display the measurement data visually, in particular on a portable data processing unit, which may be connected via a second CAN bus CAN2, or some other data bus.

Figure 7:
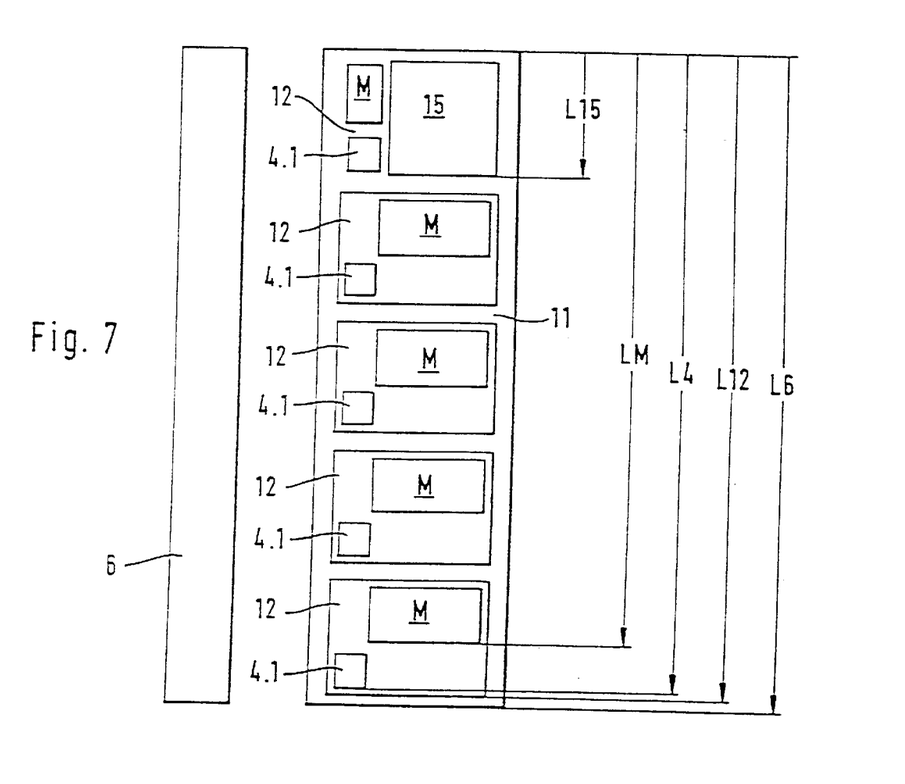
FIG. 7 shows a preferred geometric configuration of the individual modules.

The individual units are advantageously matched to a standard grid size in such a way that the individual modules are staggered in their extent along the longitudinal axis of the primary card. That end of the primary card 11 at which the base unit 15 is fitted is referred to as the origin. The greatest length L1 is produced by a row of contact units 1 which are arranged side by side, in which case L1 is of the same magnitude as the stack length L6 of the voltage source units 6. The housing 13 has a length L13 which allows a row of contact units 1, which are arranged side by side in the direction of their longitudinal axis 5, to be accommodated completely with the length L1. Primary card 11 has a length L11 which is shorter than L1. Segments 12 with multiplexer units M and associated contacts 4.1 are arranged at approximately equal intervals in the direction of the longitudinal axis of the primary card, with the maximum length being L12. The pin-type plugs 4.1 are arranged at approximately equal intervals on an axis with a length L4 parallel to the longitudinal axis of the primary card, with the length L4 being less than L11. The pin-type plugs 4.1 are preferably each fitted, starting from the origin, within in each case one segment 12 above the associated multiplexer unit M, so that a pin-type plug 4.1 in each case forms the geometric termination of a segment 12. The length LM of the row of multiplexer units M is shorter than the length L4 of the row of pin-type plugs 4.1.

The minimum size L15 of the primary card 11 is governed by the extent of the base unit 15 in the longitudinal direction of the primary card. Expediently, the same number of contact units 1 and/or contacts 2 and/or voltage source units 6 correspond to each segment 12. Each length increment of the primary card 11 accordingly corresponds to an essentially constant number of contact units 1 and/or contacts 2 and/or voltage source units 6. One segment 12 is preferably arranged alongside the base unit 15, at the same level. The minimum length L15 of the primary card 11 accordingly corresponds to a minimum number of voltage source units 6 for which the apparatus according to the invention can be used. The staggering of the lengths of the individual units is shown schematically in FIG. 7.

One preferred apparatus is designed for 196 voltage source units. The minimum size of the arrangement is governed by the length L15 of the base unit 15. The size of the base unit 15 corresponds to a stacking height of 70 voltage source units. Accordingly, the preferred apparatus allows contact to be made with any desired stack sizes between 70 and 196 voltage source units 6, with the apparatus being mounted directly on the voltage source stack. The individual units in the apparatus just need to be shortened to match the number of voltage source units 6 to be measured. In this case, staggering of the lengths of the individual units ensures that only a part of the primary card which is not required is cut off whenever the primary card 11 is shortened. If the shortening is carried out between two segments 12 in each case, this ensures that no active regions of the primary card are disconnected, so that the function of the remaining units is maintained, without any disturbance. Damage to electrical supply leads and signal tracks in the part of the primary card which is fitted in the apparatus is reliably precluded by the geometric association between the segments 12 on the primary card 11 and the contact units 1 and/or voltage source units 6, without any need for costly redesign of the apparatus for different stack lengths. If there are fewer than 70 voltage source units 6, without there being any need for costly redesign of the apparatus for different stack lengths; and in this case, the primary card 11 can either be arranged remotely from the stack, or can overhang the stack, with excess contact units 1 and/or contacts 2 being unused.

The base unit 15 is designed to be very flat, with the height of the housing 13 being at most 25 mm, so that the apparatus can be fitted even in regions where little space is available. Despite the small physical height, no external cooling is required, since the cooling via the housing surface is adequate.

Figure 8:
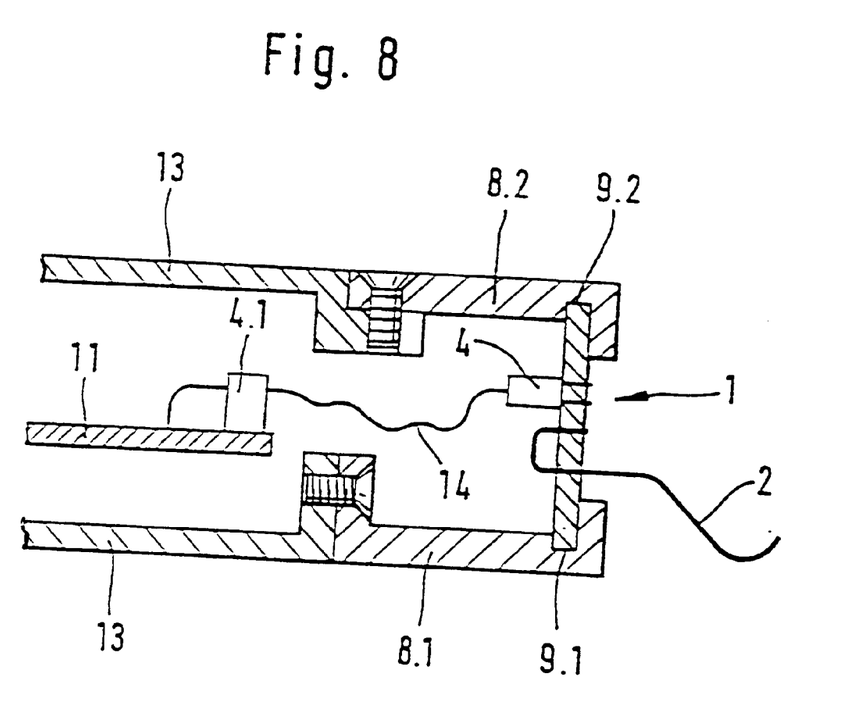
FIG. 8 shows details of a preferred arrangement of contacts.

FIG. 8 shows a side section through a preferred apparatus, illustrating details of the connection between the holding module 8 and the housing 13. The primary card 11 and the pin-type plug 4.1 are fitted inside the housing 13. A ribbon cable leads from the pin-type plug 4.1, as a flexible electrical connecting cable 14, to a contact unit 1. In particular, a rubber seal can be provided in the bushing region to the contact unit 1, in order to protect the interior of the housing from moisture and dirt. Cut-outs are provided in the side surface of the housing 13 facing the contact units 1, preferably in the regions of the pin-type plugs 4.1, as a bushing for the electrical supply leads. The holding module 8 is subdivided into a lower part 8.1 and an upper part 8.2. The two parts can be detachably connected to the housing 13 by means of screws. The lower holding module part 8.1 is screwed to the housing lower part, and the contact unit 1 is fitted at right angles into a groove 9.1 in the part 8.1. The upper part 8.2 of the holding module 8 likewise has a groove 9.2, and the part is placed on the contact unit in such a way that the contact unit 1 can be moved within the groove. In this state, the contact unit 1, together with the contacts 2 can be adjusted with respect to the voltage source units 6. In order to fix the contact units 1, the upper part 8.2 is screwed onto the housing from above, so that the pressure of the part fixes the contact unit 1. An advantageous small height of the housing 13 is achieved if the upper housing part has a projection with appropriate screw holes for accommodating the upper part 8.2 of the holding module.

The apparatus is suitable not only for tapping off voltages, but also allows other analogue signals to be recorded or fed in, and, in particular, these can be supplied by means of the intermediate unit 11 for evaluation and/or further processing.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. Apparatus for voltage measurement on a plurality of identical voltage source units, said apparatus comprising:
    a plurality of contact units, each having a longitudinal axis, and having a plurality of contacts physically mounted therein, for voltage tapping;
    an evaluation unit which is coupled in communication with the contacts; and
    an intermediate unit connected between the contact units and the evaluation unit, for one of addressing and preprocessing of measurement data; wherein,
        said plurality of contact units are arranged side by side, in a direction of their longitudinal axis, in a support module; and
        each of said contact units is geometrically associated with a segment of the intermediate unit.

2. The apparatus according to claim 1, wherein said segments and said contact units are geometrically related to a standard grid size.

3. The apparatus according to claim 1, wherein each of said contact units comprises a holder to which the electrically conductive contacts are mounted and an electrical connector for connection of the contacts to one of said evaluation unit and said intermediate unit.

4. The apparatus according to claim 1, wherein the contacts of the contact unit comprise electrical spring contacts which are detachable from said voltage source units with which contact is to be made.

5. The apparatus according to claim 1, wherein each of said contact units is arranged in the support module such that said contact units are movable along the longitudinal axis of the contact unit.

6. The apparatus according to claim 1, wherein each contact unit projects at right angles into a guide rail of the support module in such a way that the contact unit is movable along the guide rail, parallel to one of a longitudinal extent of the housing, and a stacking direction of the voltage source units.

7. The apparatus according to claim 1, wherein the evaluation unit is a central controller.

8. The apparatus according to claim 1, wherein the intermediate unit is integrated with the evaluation unit.

9. The apparatus according to claim 1, wherein each of said contact units is at least indirectly electrically connected via a ribbon cable to one of the evaluation unit and the intermediate unit.

10. The apparatus according to claim 1, wherein in addition to the segments, the intermediate unit has a base unit which has at least one of a data bus interface and a microcontroller card.

11. The apparatus according to claim 1, wherein the segments have multiplexer units and electrical connectors associated therewith for connection to the contact units.

12. The apparatus according to claim 11, wherein at least one of the contact units, the electrical connectors, regions of the multiplexer units, and segments with multiplexer units are arranged at equal intervals along a longitudinal axis of the intermediate unit.

13. The apparatus according to claim 11, wherein:
    a longitudinal extent at least of the segments, the connectors and the contact units is staggered along a longitudinal axis of the intermediate unit;
    a longitudinal extent of the contact units is a first length L1;
    a longitudinal extent of the regions of the multiplexer units is a second length LM;
    a longitudinal extent of the connectors is a third length L4; and
    a longitudinal extent of the segments is a fourth length L12;
    wherein $L1 > L12 > L4 > LM$.

14. The apparatus according to claim 11, wherein
    a longitudinal extent at least of the segments, the connectors and the contact units is staggered along a longitudinal axis of the intermediate unit; and is arranged offset with respect to the stacking direction of the voltage source units so that the function of the segments, the connectors and the contact units is maintained when shortened to a present stack length of the voltage source units.

15. The apparatus according to claim 1, wherein the support module is attachable to a housing.

16. The apparatus according to claim 1, wherein the support module is attachable to the voltage source units.

17. The apparatus according to claim 1, wherein attachments of the intermediate unit in the housing are provided with means to compensate for changes in the length of one of the intermediate unit and of the housing.

18. The apparatus according to claim 1, wherein the contact unit is connected to a discharge module, by means of which at least one voltage source unit can be discharged.

19. The apparatus according to claim 18, wherein the discharge module has means for connection of an electronic data processing device.

20. The apparatus according to claim 1, wherein the voltage source unit is a fuel cell.

21. Apparatus for measuring voltage of a plurality of voltage sources, said apparatus comprising:
- a plurality of contact units, each having a plurality of electrical contacts mounted therein, for voltage tapping of said voltage sources;
- a support module wherein said plurality of contacts are arranged side by side along a longitudinal axis; and
- an evaluation unit which is coupled in communication with the contacts;
- wherein a number of contact units included in said plurality of contact units is variable in accordance with a number of voltage sources in said plurality of voltage sources.

* * * * *